(12) United States Patent
Petry et al.

(10) Patent No.: US 9,856,417 B2
(45) Date of Patent: Jan. 2, 2018

(54) EU-ACTIVATED LUMINOPHORES

(71) Applicant: MERCK PATENT GMBH, Darmstadt (DE)

(72) Inventors: Ralf Petry, Griesheim (DE); Holger Winkler, Darmstadt (DE); Tim Vosgroene, Ober-Ramstadt (DE); Christof Hampel, Frankfurt am Main (DE); Andreas Benker, Lautertal (DE); Thomas Juestel, Witten (DE)

(73) Assignee: Merck Patent GmbH, Darmstadt (DE)

( * ) Notice: Subject to any disclaimer, the term of this patent is extended or adjusted under 35 U.S.C. 154(b) by 98 days.

(21) Appl. No.: 14/440,519

(22) PCT Filed: Oct. 4, 2013

(86) PCT No.: PCT/EP2013/002997
§ 371 (c)(1),
(2) Date: May 4, 2015

(87) PCT Pub. No.: WO2014/067609
PCT Pub. Date: May 8, 2014

(65) Prior Publication Data
US 2015/0275079 A1    Oct. 1, 2015

(30) Foreign Application Priority Data
Nov. 2, 2012 (DE) ................. 10 2012 021 570

(51) Int. Cl.
| | |
|---|---|
| C09K 11/77 | (2006.01) |
| H05B 33/14 | (2006.01) |
| H01L 33/50 | (2010.01) |
| F21V 9/16 | (2006.01) |
| F21Y 115/10 | (2016.01) |

(52) U.S. Cl.
CPC ............ *C09K 11/7734* (2013.01); *F21V 9/16* (2013.01); *H01L 33/502* (2013.01); *H01L 33/504* (2013.01); *H05B 33/14* (2013.01); *F21Y 2115/10* (2016.08)

(58) Field of Classification Search
CPC ..... C09K 11/7734; F21V 9/16; H01L 33/502; H01L 33/504; F21Y 2101/00; H05B 33/14
See application file for complete search history.

(56) References Cited

U.S. PATENT DOCUMENTS

| | | |
|---|---|---|
| 4,019,884 A | 4/1977 | Elmer et al. |
| 6,527,978 B2 | 3/2003 | Ueda et al. |
| 7,223,987 B2 | 5/2007 | Sugimoto et al. |
| 7,241,505 B2 | 7/2007 | Glaubitt et al. |
| 8,350,465 B2 | 1/2013 | Winkler et al. |
| 2001/0030314 A1 | 10/2001 | Ueda et al. |
| 2004/0248995 A1 | 12/2004 | Glaubitt et al. |
| 2006/0103310 A1 | 5/2006 | Sugimoto et al. |
| 2007/0247051 A1 | 10/2007 | Kuze et al. |
| 2009/0142598 A1 | 6/2009 | Nakamura et al. |
| 2009/0189507 A1 | 7/2009 | Winkler et al. |
| 2011/0279022 A1 | 11/2011 | Winkler et al. |
| 2012/0300155 A1 | 11/2012 | Winkler et al. |

FOREIGN PATENT DOCUMENTS

| | | |
|---|---|---|
| CN | 1264727 A | 8/2000 |
| CN | 102186944 A | 9/2011 |
| CN | 102618266 A | 8/2012 |
| EP | 1130075 A2 | 9/2001 |
| EP | 1811009 A1 | 7/2007 |
| EP | 1832641 A1 | 6/2009 |
| FR | 2205736 A1 | 5/1974 |
| GB | 1384683 A | 2/1975 |
| JP | 2001022308 A | 1/2001 |
| JP | 2002348570 A | 12/2002 |
| JP | 2005109085 A | 4/2005 |
| WO | 03027015 A1 | 4/2003 |
| WO | 2007144060 A1 | 12/2007 |
| WO | 2011091839 A1 | 8/2011 |

OTHER PUBLICATIONS

International Search Report for PCT/EP2013/002997 dated Dec. 6, 2013.
Lu, W. et al., "Spectral tuning and energy transfer in a potential fluorescent lamp phosphor BaMg2Al6Si9O30:Eu2+," Journal of Luminescence, 2012, vol. 132, pp. 2439-2442.
Pawade, V.B. et al., "Synthesis and optical studies of novel Eu2+ and Ce3+ doped BaMg8Al18Si18O72 phosphors," Solid State Sciences, 2012, vol. 14, pp. 607-610.
Kubota, S. et al., "Sr3Al10SiO20: Eu2+ as a blue luminescent material for plasma displays," Appl. Phys. Lett., Oct. 7, 2002, vol. 81, No. 15, pp. 2749-2751.
Office Action for related Chinese Patent Application No. 201380057397.1 dated Mar. 29, 2016.
Chawla, S. et al., "Role of valence state of dopant (Eu2+, Eu3+) and growth environment inluminescence and morphology of SrAl12O19 nano-and microcrystals," Materials Chemistry and Physics, 2010, vol. 122, pp. 582-587.
English Translation of Office Action for Related Patent Application No. 2015-541022, dated Jun. 5, 2017.

*Primary Examiner* — Carol M Koslow
(74) *Attorney, Agent, or Firm* — Millen White Zelano and Branigan, PC; John Sopp; Csaba Henter (57) ABSTRACT

The invention relates to $Eu^{2+}$-activated phosphors, to a process for the preparation of these compounds, and to phosphor mixtures, light sources and lighting units which comprise the $Eu^{2+}$-activated phosphors according to the invention.

12 Claims, 2 Drawing Sheets

EU-ACTIVATED LUMINOPHORES

TECHNICAL AREA

The invention relates to $Eu^{2+}$-activated phosphors, to a process for the preparation of these compounds, and to phosphor mixtures, light sources and lighting units which contain the $Eu^{2+}$-activated phosphors according to the invention.

PRIOR ART

Luminescent materials are used in fluorescent light sources, emissive display screens and as scintillator crystals for the conversion of invisible radiation or high-energy particles into visible light. A class of materials which has found widespread use for this job are $Ce^{3+}$-doped garnets, in particular $Y_3Al_5O_{12}$:Ce (YAG) and $(Gd_{1-x}Y_x)_3(Al_{1-y}Ga_y)_5O_{12}$:Ce (YAGaG:Ce), where further dopings, such as $Lu^{3+}$ or $Tb^{3+}$, have been used for optimisation of the spectrum.

As long ago as 1996, i.e. shortly after the industrial implementation of blue InGaN LEDs having high energy efficiency and a luminous flux of several candelas, white LEDs were achieved by the partial conversion of the blue light using YAG:Ce or YAGaG:Ce, since the yellow-orange emission colour of these phosphors is complementary to the blue emission colour of the LEDs, and white light can thus be obtained additively.

To date, all commercially available white LEDs have contained a blue-emitting InGaN chip which is covered with a layer of YAG:Ce or YAGaG:Ce. An essential disadvantage of this approach is on the one hand the dependence of the emission colour on the viewing angle, which is a consequence of the inhomogeneous coating of the chip. On the other hand, the colour reproduction in the case of a light source based on a dichromatic spectrum (blue+yellow-orange) is dependent on the colour temperature and low colour temperatures ($T_c$<5000 K) cannot be achieved with sufficiently high colour reproduction (CRI>80).

For this reason, the principal aim at present, in order to extend the product spectrum and in order to improve the colour reproduction of white LEDs, is the achievement of trichromatic LEDs. To this end, green- or yellow- and red-emitting phosphors having high absorption in the blue spectral region, having a high quantum yield and a high lumen equivalent must be provided.

At present, only a few efficient systems with narrow-band green emission with a main emission peak in the wavelength range between 450 and 580 nm are known. Examples thereof are green-emitting orthosilicates and thiogallates.

For many applications, for example in LCD backlights, blue- or near-UV excitable, very temperature-stable phosphors having a main emission peak between 450 and 580 nm are required. This wavelength perfectly matches the usual colour filters and enables good colour reproduction. The good temperature stability is necessary since the phosphor reaches temperatures up to 200° C. due to high chip temperatures at high powers and due to heat formed in the phosphor body.

The cause of the second warming mechanism is the so-called Stokes shift, i.e. the energy difference between absorbed and emitted photon, which is converted into heat in the phosphor.

To date, there are only a few known phosphors with narrow-band green emission which still have high efficiencies even at high temperatures, preferably at least 125° C., in particular at least 175° C., of at least 80%, in particular even at least 90%, of the efficiency at room temperature. Narrowband is taken to mean an FWHM of at most 80 nm. Green-emitting is taken to mean a phosphor whose main emission peak is in the wavelength range 440 to 580 nm.

DESCRIPTION OF THE INVENTION

Surprisingly, it has now been found that the phase-pure compounds of the formula I satisfy the said requirements, $$(A_{1-w}Eu_w)(E_{12-2z}(G_1Mg_1)_z)O_{19} \qquad I$$

in which
A denotes one or more divalent elements selected from the group Mg, Sr, Ba and Ca,
E denotes one or more trivalent elements selected from the group Al, B, Ga, In and Sc, preferably Al and Ga, particularly preferably Al,
G denotes one or more tetravalent elements selected from the group Si and Ge, preferably Si,
$0<z\leq4$, preferably $z=1$, and
$0.01\leq w\leq0.4$, preferably $0.01\leq w\leq0.1$.

The novel phosphor exhibits very good thermal and chemical stability. It is highly suitable for, for example, white LEDs, colour-on-demand (COD), TV backlighting LEDs and electric lamps, such as fluorescent lamps.

Furthermore, a process for the preparation of the novel phosphor is indicated.

DISCLOSURE OF THE INVENTION

Figure 1:
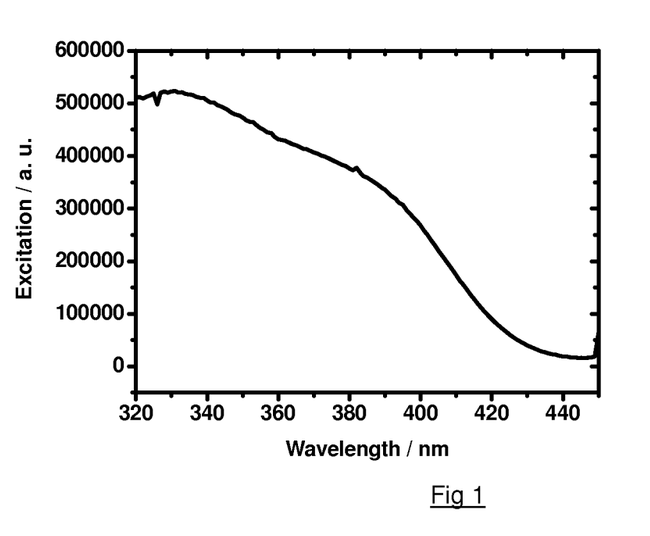
FIG. 1 shows an excitation spectrum of . The spectrum was recorded on a powder layer of semi-infinite thickness using an Edinburgh Instruments FL900 spectrometer using an Xe high-pressure lamp and a Hamamatsu photomultiplier at room temperature.
Figure 2:
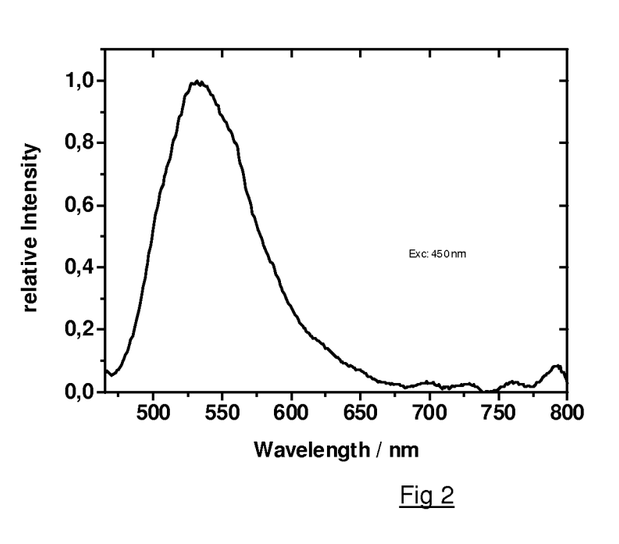
FIG. 2 shows the standardised emission spectrum of $Sr_{0.96}Eu_{0.04}Al_{10}MgSiO_{19}$ at an excitation wavelength of 450 nm. The spectrum was recorded on a powder layer of semi-infinite thickness using an Edinburgh Instruments FL900 spectrometer using an Xe high-pressure lamp and a Hamamatsu photomultiplier at room temperature.
Figure 3:
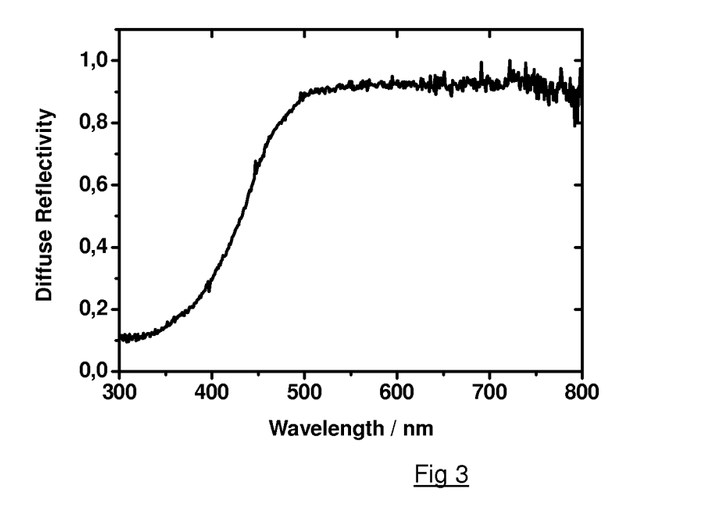
FIG. 3 shows a reflection spectrum of . The spectrum was recorded on a powder layer of semi-infinite thickness using an Edinburgh Instruments F920 spectrometer in an Ulbricht sphere using an Xe high-pressure lamp and a Hamamatsu photomultiplier at room temperature.

In a preferred embodiment, the compounds of the formula I according to the invention are selected from the compounds of the formula II, in which z is equal to 1, $$(A_{1-w}Eu_w)(E_{10}(G_1Mg_1))O_{19} \qquad II$$

and the parameters A, E, G and w have the meaning indicated in formula I.

Furthermore, compounds of the formula II are preferably selected from the compounds of the formula III in which G is equal to Si:

$$(A_{1-w}Eu_w)(E_{10}SiMg)O_{19} \qquad III$$

and in which the parameters A, E and w have the meaning indicated in formula I.

Furthermore, compounds of the formula III are preferably selected from the compounds of the formula IV in which E is equal to Al, $$(A_{1-w}Eu_w)(Al_{10}SiMg)O_{19} \quad \text{IV}$$

in which the parameters A and w have the meaning indicated in formula I.

In particular, the compounds of the formula IV are preferably selected from the compounds of the formulae V-1 to V-7, $$((Sr_sBa_rCa_t)_{1-w}Eu_w)(Al_{10}SiMg)O_{19} \quad \text{V-1}$$

$$((Ca_sBa_r)_{1-w}Eu_w)(Al_{10}SiMg)O_{19} \quad \text{V-2}$$

$$((Sr_sBa_r)_{1-w}Eu_w)(Al_{10}SiMg)O_{19} \quad \text{V-3}$$

$$((Sr_sCa_t)_{1-w}Eu_w)(Al_{10}SiMg)O_{19} \quad \text{V-4}$$

$$(Sr_{1-w}Eu_w)(Al_{10}SiMg)O_{19} \quad \text{V-5}$$

$$(Ba_{1-w}Eu_w)(Al_{10}SiMg)O_{19} \quad \text{V-6}$$

$$(Ca_{1-w}Eu_w)(Al_{10}SiMg)O_{19} \quad \text{V-7}$$

in which $0<r<1$, $0<s<1$, $0<t<1$, where $r+s+t=1$ and w has the meaning indicated under formula I.

Partial substitution of the divalent elements Sr, Ba or Ca by $Eu^{2+}$ in the host lattice surprisingly gives rise to a very efficient phosphor. It is important here that the content of divalent elements is set so that excessive energy migration between the $Eu^{2+}$ ions is prevented. Very highly suitable phosphors are obtained for $Eu^{2+}$ concentrations (w) between 0.01 and 0.4, preferably 0.01 and 0.1.

Typical working temperatures in the case of LED applications are in the region of 80° C. In this connection, temperature stabilities of at least 100° C. are desirable for LED applications. The compounds of the formula I according to the invention are distinguished by high temperature stability of at least 150° C., preferably at least 200° C.

The compounds of the formula I according to the invention are furthermore distinguished by their high chemical stability. Thus, the compounds of the formula I are insensitive to oxidation and hydrolysis.

The invention furthermore relates to a process for the preparation of the compound of the formula I comprising the following steps:
1. Mixing of a magnesium compound, preferably magnesium carbonate, with
   a) silicon dioxide and/or germanium dioxide,
   b) at least one aluminium, indium, scandium and/or gallium compound, preferably selected from aluminium carbonate, indium carbonate, scandium carbonate and/or gallium carbonate,
   c) at least one barium, strontium and/or calcium compound, preferably selected from barium carbonate, strontium carbonate and/or calcium carbonate, and
   d) at least one europium compound, preferably selected from europium oxide, europium carbonate, europium nitrate and/or europium oxalate,
2. Thermal treatment of the mixture.

In the case of the above-mentioned thermal treatment, the reaction is usually carried out at a temperature above 800° C. The thermal treatment is preferably carried out in a multistep process, particularly preferably in a 2-step process, i.e. firstly calcination is carried out under air at a temperature >800° C. and subsequently preferably at a temperature >1000° C., particularly preferably at a temperature of 1200 to 1800° C., under reducing conditions (for example using carbon monoxide, forming gas or hydrogen or oxygen-deficient atmosphere).

In a further embodiment according to the invention, inorganic or organic substances from the group of the ammonium halides, alkaline-earth metal fluorides, such as calcium fluoride, strontium fluoride or barium fluoride, alkaline-earth or alkali-metal borates, boric acid, alkaline-earth or alkali-metal carbonates or ammonium hydrogencarbonate, citric acid, alcoholates, as well as oxalates and/or silicates, such as, for example, TEOS, can be employed before the thermal treatment. It is preferred to add citric acid and an oxalate.

The phosphors according to the invention can be prepared either by a conventional solid-state diffusion method (starting from the oxides, nitrates, carbonates or halides of the corresponding alkaline-earth metals, semimetals, metals or rare earths) or by wet-chemical methods from inorganic and/or organic semi-metal and/or metal and/or rare-earth salts by means of the sol-gel method, the coprecipitation method and/or the drying method.

In the wet-chemical processes via aqueous precursors of the phosphors, the following methods are known:
Coprecipitation with an $NH_4HCO_3$ solution (see, for example, Jander, Blasius Lehrbuch der analyt. u. präp. anorg. Chem. 2002 [Blasius's Textbook of Analyt. and Prep. Inorg. Chem.2002])
Pecchini process with a solution of citric acid and ethylene glycol (see, for example, Annual Review of Materials Research Vol. 36: 2006, 281-331)
Combustion process using urea
Spray drying of aqueous or organic salt solutions (starting materials)
Spray pyrolysis of aqueous or organic salt solutions (starting materials)
Evaporation of nitrate solutions and thermal conversion of the residue
Precipitation with a solution comprising citric acid or oxalate In the case of the above-mentioned coprecipitation, a $TEOS/NH_4HCO_3$ solution is added to, for example, chloride solutions of the corresponding phosphor starting materials, resulting in the formation of the phosphor precursor, which is subsequently converted into the phosphor by one- or multistep thermal treatment.

In the case of the Pecchini process, a precipitation reagent consisting of citric acid and ethylene glycol is added to, for example, nitrate solutions of the corresponding phosphor starting materials at room temperature, and the mixture is subsequently heated. The increase in viscosity results in the formation of the phosphor precursor.

In the case of the combustion process, nitrate solutions, for example, of the corresponding starting materials are dissolved in water, the solution is then refluxed, and urea is added, resulting in the slow formation of the phosphor precursor.

Spray pyrolysis is one of the aerosol processes, which are characterised by spraying of solutions, suspensions or dispersions into a reaction space (reactor) heated in various ways and the formation and deposition of solid particles. In contrast to spray drying at hot-gas temperatures <200° C., spray pyrolysis, as a high-temperature process, involves thermal decomposition of the starting materials used (for example salts) and the re-formation of substances (for example oxides or mixed oxides) in addition to evaporation of the solvent.

In the case of precipitation using a solution of citric acid or oxalate, oxides or carbonate solutions, for example, of the corresponding starting materials are dissolved in conc. $HNO_3$, and the above-mentioned solution is subsequently added, before the mixture is then evaporated or filtered. This method is preferred in accordance with the invention.

The first six of the process variants mentioned above are described in detail in WO 2007/144060 (Merck), which is incorporated in its full scope into the context of the present application by way of reference.

Compounds of the formula I are distinguished, in particular, by the fact that they can be excited by radiation in the wavelength range from 300 nm to 450 nm to emit visible light in the wavelength range from 440 nm to 580 nm.

In the context of this application, UV light refers to light whose emission maximum is between 300 and 399 nm, blue light refers to light whose emission maximum is between 400 and 459 nm, cyan light refers to light whose emission maximum is between 460 and 505 nm, green light refers to light whose emission maximum is between 506 and 545 nm, yellow light refers to light whose emission maximum is between 546 and 565 nm, orange light refers to light whose emission maximum is between 566 and 600 nm and red light refers to light whose emission maximum is between 601 and 670 nm. The compounds of the formula I according to the invention are preferably green-emitting conversion phosphors.

Depending on the composition, in particular with respect to the variation of parameter A, the emission can be varied specifically. Thus, in particular, the compounds of the formula V-1 are preferably excited by radiation in the wavelength range from 300 nm to 450 nm and emit light in the wavelength range from 440 nm to 580 nm with a full width at half maximum (FWHM) value of the main emission peak of at most 80 nm.

Compounds of the formula V-5 are preferably excited by radiation in the wavelength range from 300 nm to 450 nm and emit light in the wavelength range from 440 nm to 550 nm with a full width at half maximum (FWHM) value of the main emission peak of at most 80 nm.

Compounds of the formula V-6 are preferably excited by radiation in the wavelength range from 300 nm to 450 nm and emit light in the wavelength range from 440 nm to 500 nm with a full width at half maximum (FWHM) value of the main emission peak of at most 80 nm.

The full width at half maximum (FWHM) value is a parameter which is frequently used in order to describe the width of a peak or a function. It is defined in a two-dimensional coordinate system (x,y) by the separation ($\Delta x$) between two points on the curve with the same y value at which the function reaches half its maximum width ($y_{max}/2$).

The particle size of the phosphors according to the invention is usually between 50 μm and 1 μm, preferably between 30 μm and 3 μm, particularly preferably between 20 μm and 5 μm.

In a further preferred embodiment, the phosphors in particle form have a continuous surface coating. This surface coating has the advantage that, through a suitable grading of the refractive indices of the coating materials, the refractive index can be matched to the environment. In this case, the scattering of light at the surface of the phosphor is reduced and a greater proportion of the light can penetrate into the phosphor and be absorbed and converted therein. In addition, the refractive index-matched surface coating enables more light to be coupled out of the phosphor since total internal reflection is reduced.

In addition, a continuous layer is advantageous if the phosphor has to be encapsulated. This may be necessary in order to counter sensitivity of the phosphor or parts thereof to diffusing water or other materials in the immediate environment. A further reason for encapsulation with a closed shell is thermal decoupling of the actual phosphor from the heat generated in the LED. This heat results in a reduction in the fluorescence light yield of the phosphor and may also influence the colour of the fluorescence light. Finally, a coating of this type enables the efficiency of the phosphor to be increased by preventing lattice vibrations arising in the phosphor from propagating to the environment.

In addition, it is preferred for the phosphors to have a porous surface coating. These porous coatings offer the possibility of further reducing the refractive index of a single layer. Porous coatings of this type can be produced by three conventional methods, as described in WO 03/027015, which is incorporated in its full scope into the context of the present application by way of reference: the etching of glass (for example soda-lime glasses (see U.S. Pat. No. 4,019,884)), the application of a porous layer, and the combination of a porous layer and an etching operation.

Preference is given to porous coatings which consist of $SiO_2$, $TiO_2$, $Al_2O_3$, ZnO, $ZrO_2$ and/or $Y_2O_3$ or mixed oxides thereof.

In a further preferred embodiment, the phosphor particles have a surface which carries functional groups which facilitate chemical bonding to the environment, preferably consisting of epoxy or silicone resin. These functional groups can be, for example, esters or other derivatives which are bonded via oxo groups and are able to form links to constituents of the binders based on epoxides and/or silicones. Surfaces of this type have the advantage that homogeneous incorporation of the phosphors into the binder is facilitated. Furthermore, the rheological properties of the phosphor/binder system and also the pot lives can thereby be adjusted to a certain extent. Processing of the mixtures is thus simplified.

The present invention furthermore also relates to the use of the compounds of the formula I according to the invention as phosphors, in particular as conversion phosphors.

The term "conversion phosphor" in the present application is taken to mean a material which absorbs radiation in a certain wavelength range of the electromagnetic spectrum, preferably in the blue or UV spectral region, and emits visible light in another wavelength region of the electromagnetic spectrum, preferably in the red, orange, yellow or green spectral region, in particular in the green spectral region.

The term "radiation-induced emission efficiency" is also to be placed in this context, i.e. the conversion phosphor absorbs radiation in a certain wavelength region and emits radiation in another wavelength region with a certain efficiency. The increase in the emission efficiency is measured in the increase in the emitted light intensity.

The term "shift in the emission wavelength" is taken to mean that a conversion phosphor emits light at another wavelength compared with another or similar conversion phosphor, i.e. shifted towards a shorter or longer wavelength. The emission maximum is thus shifted.

The present invention furthermore relates to a phosphor mixture comprising the compounds of the formula I according to the invention. The phosphor mixture may consist exclusively of compounds of the formula I according to the invention and would in this case be equivalent to the term "phosphor or conversion phosphor" defined above.

It is also possible for the phosphor mixture according to the invention also to comprise further conversion phosphors in addition to the compound of the formula I according to the invention. In this case, the phosphor mixture according to the invention comprises a mixture of at least two conversion phosphors, where one of these is a conversion phosphor according to the invention. It is at least preferred for the two conversion phosphors to be phosphors which emit light of different wavelengths, which are preferably complementary to one another. The green-emitting conversion phosphor according to the invention can be employed in combination with blue- and red-emitting conversion phosphors (RGB concept). Alternatively, the conversion phosphor according to the invention can also be employed in combination with a red-emitting conversion phosphor. It may thus be preferred for the conversion phosphor according to the invention to be employed in combination with one or more further conversion phosphors in the phosphor mixture according to the invention, which then preferably emit white light together.

As a further conversion phosphor which can be employed together with the compounds according to the invention, it is generally possible to employ any possible conversion phosphor. The following are suitable, for example: $Ba_2SiO_4$:$Eu^{2+}$, $BaSi_2O_5$:$Pb^{2+}$, $Ba_xSr_{1-x}F_2$:$Eu^{2+}$, $BaSrMgSi_2O_7$:$Eu^{2+}$, $BaTiP_2O_7$, $(Ba,Ti)_2P_2O_7$:Ti, $Ba_3WO_6$:U, $BaY_2F_5$:$Er^{3+}$, $Yb^+$, $Be_2SiO_4$:$Mn^{2+}$, $Bi_4Ge_3O_{12}$, $CaAl_2O_4$:$Ce^{3+}$, $CaLa_4O_7$:$Ce^{3+}$, $CaAl_2O_4$:$Eu^{2+}$, $CaAl_2O_4$:$Mn^{2+}$, $CaAl_4O_7$:$Pb^{2+},Mn^{2+}$, $CaAl_2O_4$:$Tb^{3+}$, $Ca_3Al_2Si_3O_{12}$:$Ce^{3+}$, $Ca_3Al_2Si_3O_{12}$:$Ce^{3+}$, $Ca_3Al_2Si_3O_2$:$Eu^{2+}$, $Ca_2B_5O_9Br$:$Eu^{2+}$, $Ca_2B_5O_9Cl$:$Eu^{2+}$, $Ca_2B_5O_9Cl$:$Pb^{2+}$, $CaB_2O_4$:$Mn^{2+}$, $Ca_2B_2O_5$:$Mn^{2+}$, $CaB_2O_4$:$Pb^{2+}$, $CaB_2P_2O_9$:$Eu^{2+}$, $Ca_5B_2SiO_{10}$:$Eu^{3+}$, $Ca_{0.5}Ba_{0.5}Al_{12}O_{19}$:$Ce^{3+},Mn^{2+}$, $Ca_2Ba_3(PO_4)_3Cl$:$Eu^{2+}$, $CaBr_2$:$Eu^{2+}$ in $SiO_2$, $CaCl_2$:$Eu^{2+}$ in $SiO_2$, $CaCl_2$:$Eu^{2+},Mn^{2+}$ in $SiO_2$, $CaF_2$:$Ce^{3+}$, $CaF_2$:$Ce^{3+},Mn^{2+}$, $CaF_2$:$Ce^{3+},Tb^{3+}$, $CaF_2$:$Eu^{2+}$, $CaF_2$:$Mn^{2+}$, $CaF_2$:U, $CaGa_2O_4$:$Mn^{2+}$, $CaGa_4O_7$:$Mn^{2+}$, $CaGa_2S_4$:$Ce^{3+}$, $CaGa_2S_4$:$Eu^{2+}$, $CaGa_2S_4$:$Mn^{2+}$, $CaGa_2S_4$:$Pb^{2+}$, $CaGeO_3$:$Mn^{2+}$, $CaI_2$:$Eu^{2+}$ in $SiO_2$, $CaI_2$:$Eu^{2+},Mn^{2+}$ in $SiO_2$, $CaLaBO_4$:$Eu^{3+}$, $CaLaB_3O_7$:$Ce^{3+},Mn^{2+}$, $Ca_2La_2BO_{6.5}$:$Pb^{2+}$, $Ca_2MgSi_2O_7$, $Ca_2MgSi_2O_7$:$Ce^{3+}$, $CaMgSi_2O_6$:$Eu^{2+}$, $Ca_3MgSi_2O_8$:$Eu^{2+}$, $Ca_2MgSi_2O_7$:$Eu^{2+}$, $CaMgSi_2O_6$:$Eu^{2+},Mn^{2+}$, $Ca_2MgSi_2O_7$:$Eu^{2+},Mn^{2+}$, $CaMoO_4$, $CaMoO_4$:$Eu^{3+}$, $CaO$:$Bi^{3+}$, $CaO$:$Cd^{2+}$, $CaO$:$Cu^+$, $CaO$:$Eu^{3+}$, $CaO$:$Eu^{3+}$, $Na^+$, $CaO$:$Mn^{2+}$, $CaO$:$Pb^{2+}$, $CaO$:$Sb^{3+}$, $CaO$:$Sm^{3+}$, $CaO$:$Tb^{3+}$, $CaO$:Tl, $CaO$:$Zn^{2+}$, $Ca_2P_2O_7$:$Ce^{3+}$, $\alpha$-$Ca_3(PO_4)_2$:$Ce^{3+}$, $\beta$-$Ca_3(PO_4)_2$:$Ce^{3+}$, $Ca_6(PO_4)_3Cl$:$Eu^{2+}$, $Ca_6(PO_4)_3Cl$:$Mn^{2+}$, $Ca_6(PO_4)_3Cl$:$Sb^{3+}$, $Ca_5(PO_4)_3Cl$:$Sn^{2+}$, $\beta$-$Ca_3(PO_4)_2$:$Eu^{2+},Mn^{2+}$, $Ca_6(PO_4)_3F$:$Mn^{2+}$, $Ca_s(PO_4)_3F$:$Sb^{3+}$, $Ca_s(PO_4)_3F$:$Sn^{2+}$, $\alpha$-$Ca_3(PO_4)_2$:$Eu^{2+}$, $\beta$-$Ca_3(PO_4)_2$:$Eu^{2+}$, $Ca_2P_2O_7$:$Eu^{2+}$, $Ca_2P_2O_7$:$Eu^{2+},Mn^{2+}$, $CaP_2O_6$:$Mn^{2+}$, $\alpha$-$Ca_3(PO_4)_2$:$Pb^{2+}$, $\alpha$-$Ca_3(PO_4)_2$:$Sn^{2+}$, $\beta$-$Ca_3(PO_4)_2$:$Sn^{2+}$, $\beta$-$Ca_2P_2O_7$:Sn,Mn, $\alpha$-$Ca_3(PO_4)_2$:Tr, $CaS$:$Bi^{3+}$, $CaS$:$Bi^{3+}$, Na, $CaS$:$Ce^{3+}$, $CaS$:$Eu^{2+}$, $CaS$:$Cu^+,Na^+$, $CaS$:$La^{3+}$, $CaS$:$Mn^{2+}$, $CaSO_4$:Bi, $CaSO_4$:$Ce^{3+}$, $CaSO_4$:$Ce^{3+},Mn^{2+}$, $CaSO_4$:$Eu^{2+}$, $CaSO_4$:$Eu^{2+},Mn^{2+}$, $CaSO_4$:$Pb^{2+}$, $CaS$:$Pb^{2+}$, $CaS$:$Pb^{2+}$,Cl, $CaS$:$Pb^{2+},Mn^{2+}$, $CaS$:$Pr^{3+}$, $Pb^{2+}$, Cl, $CaS$:$Sb^{3+}$, $CaS$:$Sb^{3+}$,Na, $CaS$:$Sm^{3+}$, $CaS$:$Sn^{2+}$, $CaS$:$Sn^{2+}$, F, $CaS$:$Tb^{3+}$, $CaS$:$Tb^{3+}$,Cl, $CaS$:$Y^{3+}$, $CaS$:$Yb^{2+}$, $CaS$:$Yb^{2+}$,Cl, $CaSiO_3$:$Ce^{3+}$, $Ca_3SiO_4Cl_2$:$EU^{2+}$, $Ca_3SiO_4Cl_2$:$Pb^{2+}$, $CaSiO_3$:$EU^{2+}$, $CaSiO_3$:$Mn^{2+}$, Pb, $CaSiO_3$:$Pb^{2+}$, $CaSiO_3$:$Pb^{2+},Mn^{2+}$, $CaSiO_3$:$Ti^{4+}$, $CaSr_2(PO_4)_2Bi^{3+}$, $\beta$-$(Ca,Sr)_3(PO_4)_2$:$Sn^{2+}$ $Mn^{2+}$, $CaTi_{0.9}Al_{0.1}O_3$:$Bi^{3+}$, $CaTiO_3$:$EU^{3+}$, $CaTiO_3$:$Pr^{3+}$, $Ca_5(VO_4)_3Cl$, $CaWO_4$, $CaWO_4Pb^{2+}$, $CaWO_4$:W, $Ca_3WO_6$:U, $CaYAlO_4$:$Eu^{3+}$, $CaYBO_4$:$Bi^{3+}$, $CaYBO_4$:$Eu^{3+}$, $CaYB_{0.8}O_{3-7}$:$Eu^{3+}$, $CaY_2ZrO_6$:$Eu^{3+}$, $(Ca,Zn,Mg)_3(PO_4)_2$:Sn, $CeF_3$, $(Ce,Mg)BaAl_{11}O_{18}$:Ce, $(Ce,Mg)SrAl_{11}O_{18}$:Ce, $CeMgAl_{11}O_{19}$:Ce:Tb, $Cd_2B_6O_{11}$:$Mn^{2+}$, CdS:Ag+, Cr, CdS:In, CdS:In, CdS:In, Te, CdS:Te, $CdWO_4$, CsF, CsI, CsI:$Na^+$, CsI:Tl, $(ErCl_3)_{0.25}(BaCl_2)_{0-75}$, GaN:Zn, $Gd_3Ga_6O_{12}$:$Cr^{3+}$, $Gd_3Ga_6O_{12}$:Cr,Ce, $GdNbO_4$:$Bi^{3+}$, $Gd_2O_2S$:$Eu^{3+}$, $Gd_2O_2Pr^{3+}$, $Gd_2O_2S$:Pr,Ce,F, $Gd_2O_2S$:$Tb^{3+}$, $Gd_2SiO_6$:$Ce^{3+}$, $KAl_{11}O_{17}$:$Tl^+$, $KGa_{11}O_{17}$:$Mn^{2+}$, $K_2La_2Ti_3O_{10}$:Eu, $KMgF_3$:$Eu^{2+}$, $KMgF_3$:$Mn^{2+}$, $K_2SiF_6$:$Mn^{4+}$, $LaAl_3B_4O_{12}$:$Eu^{3+}$, $LaAlB_2O_6$:$Eu^{3+}$, $LaAlO_3$:$Eu^{3+}$, $LaAlO_3$:$Sm^{3+}$, $LaAsO_4$:$Eu^{3+}$, $LaBr_3$:$Ce^{3+}$, $LaBO_3$:$Eu^{3+}$, $(La,Ce,Tb)PO_4$:Ce:Tb, $LaCl_3$:$Ce^{3+}$, $La_2O_3$:$Bi^{3+}$, LaOBr:$Tb^{3+}$, LaOBr:$Tm^{3+}$, LaOCl:$Bi^{3+}$, LaOCl:$Eu^{3+}$, LaOF:$Eu^{3+}$, $La_2O_3$:$Eu^{3+}$, $La_2O_3$:$Pr^{3+}$, $La_2O_2S$:$Tb^{3+}$, $LaPO_4$:$Ce^{3+}$, $LaPO_4$:$Eu^{3+}$, $LaSiO_3Cl$:$Ce^{3+}$, $LaSiO_3Cl$:$Ce^{3+},Tb^{3+}$, $LaVO_4$:$Eu^{3+}$, $La_2W_3O_{12}$:$Eu^{3+}$, $LiAlF_4$:$Mn^{2+}$, $LiAl_6O_8$:$Fe^{3+}$, $LiAlO_2$:$Fe^{3+}$, $LiAlO_2$:$Mn^{2+}$, $LiAl_6O_8$:$Mn^{2+}$, $Li_2CaP_2O_7$:$Ce^{3+},Mn^{2+}$, $LiCeBa_4Si_4O_{14}$:$Mn^{2+}$, $LiCeSrBa_3Si_4O_{14}$:$Mn^{2+}$, $LiInO_2$:$Eu^{3+}$, $LiInO_2$:$Sm^{3+}$, $LiLaO_2$:$Eu^{3+}$, $LuAlO_3$:$Ce^{3+}$, $(Lu,Gd)_2SiO_6$:$Ce^{3+}$, $Lu_2SiO_5$:$Ce^{3+}$, $Lu_2Si_2O_7$:$Ce^{3+}$, $LuTaO_4$:$Nb^{5+}$, $Lu_{1-x}Y_xAlO_3$:$Ce^{3+}$, $MgAl_2O_4$:$Mn^{2+}$, $MgSrAl_{10}O_{17}$:Ce, $MgB_2O_4$:$Mn^{2+}$, $MgBa_2(PO_4)_2$:$Sn^{2+}$, $MgBa_2(PO_4)_2$:U, $MgBaP_2O_7$:$Eu^{2+}$, $MgBaP_2O_7$:$Eu^{2+},Mn^{2+}$, $MgBa_3Si_2O_8$:$Eu^{2+}$, $MgBa(SO_4)_2$:$Eu^{2+}$, $Mg_3Ca_3(PO_4)_4$:$Eu^{2+}$, $MgCaP_2O_7$:$Mn^{2+}$, $Mg_2Ca(SO_4)_3$:$Eu^{2+}$, $Mg_2Ca(SO_4)_3$:$Eu^{2+},Mn^2$, $MgCeAl_nO_{19}$:$Tb^{3+}$, $Mg_4(F)GeO_6$:$Mn^{2+}$, $Mg_4(F)(Ge, Sn)O_6$:$Mn^{2+}$, $MgF_2$:$Mn^{2+}$, $MgGa_2O_4$:$Mn^{2+}$, $Mg_8Ge_2O_{11}F_2$:$Mn^{4+}$, MgS:$Eu^{2+}$, $MgSiO_3$:$Mn^{2+}$, $Mg_2SiO_4$:$Mn^{2+}$, $Mg_3SiO_3F_4$:$Ti^{4+}$, $MgSO_4$:$Eu^{2+}$, $MgSO_4$:$Pb^{2+}$, $MgSrBa_2Si_2O_7$:$Eu^{2+}$, $MgSrP_2O_7$:$Eu^{2+}$, $MgSr_5(PO_4)_4$:$Sn^{2+}$, $MgSr_3Si_2O_8$:$Eu^{2+},Mn^{2+}$, $Mg_2Sr(SO_4)_3$:$Eu^{2+}$, $Mg_2TiO_4$:$Mn^{4+}$, $MgWO_4$, $MgYBO_4$:$Eu^{3+}$, $Na_3Ce(PO_4)_2$:$Tb^{3+}$, NaI:Tl, $Na_{1.23}K_{0.42}Eu_{0.12}TiSi_4O_{11}$:$Eu^{3+}$, $Na_{1.23}K_{0.42}Eu_{0.12}TiSi_5O_{13}$·x$H_2O$:$Eu^{3+}$, $Na_{1.29}K_{0.46}Er_{0.08}TiSi_4O_{11}$:$Eu^{3+}$, $Na_2Mg_3Al_2Si_2O_{10}$:Tb, Na$(Mg_2,Mn_x)LiSi_4O_{10}F_2$:Mn, $NaYF_4$:$Er^{3+}$, $Yb^{3+}$, NaYO$_2$:$Eu^{3+}$, P46(70%)+P47 (30%), $SrAl_{12}O_{19}$:$Ce^{3+}$, $Mn^{2+}$, $SrAl_2O_4$:$Eu^{2+}$, $SrAl_4O_7$:$Eu^{3+}$, $SrAl_{12}O_{19}$:$Eu^{2+}$, $SrAl_2S_4$:$Eu^{2+}$, $Sr_2B_5O_9Cl$:$Eu^{2+}$, $SrB_4O_7$:$Eu^{2+}$(F,Cl,Br), $SrB_4O_7$:$Pb^{2+}$, $SrB_4O_7$:$Pb^{2+}$, $Mn^{2+}$, $SrB_8O_{13}$:$Sm^{2+}$, $Sr_xBa_yCl_zAl_2O_{4-z/2}$:$Mn^{2+}$, $Ce^{3+}$, $SrBaSiO_4$:$Eu^{2+}$, $Sr(Cl,Br,I)_2$:$Eu^{2+}$ in $SiO_2$, $SrCl_2$:$Eu^{2+}$ in $SiO_2$, $Sr_5Cl(PO_4)_3$:Eu, $Sr_wF_xB_4O_{6.5}$:$Eu^{2+}$, $SrF_xB_yO_z$:$Eu^{2+}$, $Sm^{2+}$, $SrF_2$:$Eu^{2+}$, $SrGa_{12}O_{19}$:$Mn^{2+}$, $SrGa_2S_4$:$Ce^{3+}$, $SrGa_2S_4$:$Eu^{2+}$, $SrGa_2S_4$:$Pb^{2+}$, $SrIn_2O_4$:$Pr^{3+}$, $Al^{3+}$, $(Sr,Mg)_3(PO_4)_2$:Sn, $SrMgSi_2O_6$:$Eu^{2+}$, $Sr_2MgSi_2O_7$:$Eu^{2+}$, $Sr_3MgSi_2O_8$:$Eu^{2+}$, $SrMoO_4$:U, $SrO.3B_2O_3$:$Eu^{2+}$,Cl, B—$SrO.3B_2O_3$:$Pb^{2+}$, $\beta$-$SrO.3B_2O_3$:$Pb^{2+},Mn^{2+}$, $\alpha$-$SrO.3B_2O_3$:$Sm^{2+}$, $Sr_6P_5BO_{20}$:Eu, $Sr_5(PO_4)_3Cl$:$Eu^{2+}$, $Sr_5(PO_4)_3Cl$:$Eu^{2+},Pr^{3+}$, $Sr_5(PO_4)_3Cl$:$Mn^{2+}$, $Sr_5(PO_4)_3Cl$:$Sb^{3+}$, $Sr_2P_2O_7$:$Eu^{2+}$, $\beta$-$Sr_3(PO_4)_2$:$Eu^{2+}$, $Sr_5(PO_4)_3F$:$Mn^{2+}$, $Sr_5(PO_4)_3F$:$Sb^{3+}$, $Sr_5(PO_4)_3F$:$Sb^{3+},Mn^{2+}$, $Sr_5(PO_4)_3F$:$Sn^{2+}$, $Sr_2P_2O_7Sn^{2+}$, $\beta$-$Sr_3(PO_4)_2$:$Sn^{2+}$, $\beta$-$Sr_3(PO_4)_2$:$Sn^{2+},Mn^{2+}$(Al), SrS:$Ce^{3+}$, SrS:$Eu^{2+}$, SrS:$Mn^{2+}$, SrS:$Cu^+$,Na, $SrSO_4$:Bi, $SrSO_4$:$Ce^{3+}$, $SrSO_4$:$Eu^{2+}$, $SrSO_4$:$Eu^{2+},Mn^{2+}$, $Sr_5Si_4O_{10}Cl_6$:$Eu^{2+}$, $Sr_2SiO_4$:$Eu^{2+}$, $SrTiO_3$:$Pr^{3+}$, $SrTiO_3$:$Pr^{3+}$, $Al^{3+}$, $Sr_3WO_6$:U, $SrY_2O_3$:$Eu^{3+}$, $ThO_2$:$Eu^{3+}$, $ThO_2$:$Pr^{3+}$, $ThO_2$:$Tb^{3+}$, $YAl_3B_4O_{12}$:$Bi^{3+}$, $YAl_3B_4O_{12}$:$Ce^{3+}$, $YAl_3B_4O_{12}$:$Ce^{3+}$, Mn, $YAl_3B_4O_{12}$:$Ce^{3+},Tb^{3+}$, $YAl_3B_4O_{12}$:$Eu^{3+}$, $YAl_3B_4O_{12}$:$Eu^{3+}$, $Cr^{3+}$, $YAl_3B_4O_{12}$:$Th^{4+},Ce^{3+},Mn^{2+}$, $YAlO_3$:$Ce^{3+}$, $Y_3Al_5O_{12}$:$Ce^{3+}$, $Y_3Al_5O_{12}$:$Cr^{3+}$, $YAlO_3$:$Eu^{3+}$, $Y_3Al_5O_{12}$:$Eu^{3r}$, $Y_4Al_2O_9$:$Eu^{3+}$, $Y_3Al_5O_{12}$:$Mn^{4+}$, $YAlO_3$:$Sm^{3+}$, $YAlO_3$:$Tb^{3+}$, $Y_3Al_5O_{12}$:$Tb^{3+}$, $YAsO_4$:$Eu^{3+}$, $YBO_3$:$Ce^{3+}$, $YBO_3$:$Eu^{3+}$, $YF_3$:$Er^{3+},Yb^{3+}$, $YF_3$:$Mn^{2+}$, $YF_3$:$Mn^{2+}$, $Th^{4+}$, $YF_3$:$Tm^{3+},Yb^{3+}$, $(Y,Gd)BO_3$:Eu, $(Y,Gd)BO_3$:Tb, $(Y,Gd)_2O_3$:$Eu^{3+}$, $Y_{1.34}Gd_{0.60}O_3$(Eu, Pr), $Y_2O_3$:$Bi^{3+}$, YOBr:$Eu^{3+}$, $Y_2O_3$:Ce, $Y_2O_3$:$Er^{3+}$, $Y_2O_3$:$Eu^{3+}$(YOE), $Y_2O_3$:$Ce^{3+},Tb^{3+}$, YOCl:$Ce^{3+}$, YOCl:$Eu^{3+}$, YOF:$Eu^{3+}$, YOF:$Tb^{3+}$, $Y_2O_3$:$Ho^{3+}$, $Y_2O_2S$:$Eu^{3+}$, $Y_2O_2S$:$Pr^{3+}$, $Y_2O_2S$:$Tb^{3+}$, $Y_2O_3$:$Tb^{3+}$, $YPO_4$:$Ce^{3+}$, $YPO_4$:$Ce^{3+},Tb^{3+}$, $YPO_4$:$Eu^{3+}$, $YPO_4$:$Mn^{2+}$, $Th^{4+}$, $YPO_4$:$V^{5+}$, $Y(P,V)O_4$:Eu, $Y_2SiO_5$:$Ce^{3+}$, $YTaO_4$, $YTaO_4$:$Nb^{5+}$, $YVO_4$:$Dy^{3+}$, $YVO_4$:$Eu^{3+}$, $ZnAl_2O_4$:$Mn^{2+}$, $ZnB_2O_4$:$Mn^{2+}$, $ZnBa_2S_3$:$Mn^{2+}$, $(Zn,Be)_2SiO_4$:$Mn^{2+}$, $Zn_{0.4}Cd_{0.6}S$:Ag, $Zn_{0.6}Cd_{0.4}S$:Ag, (Zn,Cd)S:Ag,Cl, (Zn,Cd)S:Cu, $ZnF_2$:$Mn^{2+}$, $ZnGa_2O_4$, $ZnGa_2O_4$:$Mn^{2+}$, $ZnGa_2S_4$:$Mn^{2+}$, $Zn_2GeO_4$:$Mn^{2+}$, $(Zn,Mg)F_2$:$Mn^{2+}$, $ZnMg_2(PO_4)_2$:$Mn^{2+}$, $(Zn,Mg)_3(PO_4)_2$:$Mn^{2+}$, ZnO:$Al^{3+}$, $Ga^{3+}$, ZnO:$Bi^{3+}$, ZnO:$Ga^{3+}$, ZnO:Ga, ZnO—CdO:Ga, ZnO:S, ZnO:Se, ZnO:Zn, ZnS:Ag,Cu,Cl, ZnS:Ag,Ni, ZnS:Au,In, ZnS—CdS (25-75), ZnS—CdS (50-50), ZnS—CdS (75-25), ZnS—CdS:Ag,Br, Ni, ZnS—CdS:Ag+,Cl, ZnS—CdS:Cu,Br, ZnS—CdS:Cu,I, ZnS:Cl⁻, ZnS:Eu²⁺, ZnS:Cu, ZnS:Cu⁺,Al³⁺, ZnS:Cu,Sn, ZnS:Eu²⁺, ZnS:Mn²⁺, ZnS:Mn,Cu, ZnS:Mn²⁺,Te²⁺, ZnS:P, ZnS:Pb²⁺, ZnS:Pb²⁺,Cl⁻, ZnS:Pb,Cu, Zn₃(PO₄)₂:Mn²⁺, Zn₂SiO₄:Mn²⁺, Zn₂SiO₄:Mn²⁺,As⁵⁺, Zn₂SiO₄:Mn,Sb₂O₂, Zn₂SiO₄:Mn²⁺,P, Zn₂SiO₄:Ti⁴⁺, ZnS:Sn²⁺, ZnS:Sn,Ag, ZnS:Sn²⁺,Li+, ZnS:Te,Mn, ZnSZnTe:Mn²+, ZnSe:Cu⁺,Cl or ZnWO₄.

The present invention furthermore relates to the use of the phosphor mixture according to the invention in a light source. The light source is particularly preferably an LED, in particular a phosphor-converted LED, pc-LED for short. It is particularly preferred here for the phosphor mixture, besides the green-emitting conversion phosphor according to the invention, to comprise at least one further, preferably red-emitting conversion phosphor, in particular so that the light source overall emits white light or alternatively also, in another preferred embodiment, light having a certain colour point (colour-on-demand principle).

The colour-on-demand concept is taken to mean the achievement of light of a certain colour point using a pcLED (=phosphor converted LED) using one or more phosphors. This concept is used, for example, in order to produce certain corporate designs, for example for illuminated company logos, brand names, etc.

The LED quality is described via conventional parameters, such as, for example, the colour rendering index or the colour point in CIE x and CIE y coordinates.

The colour rendering index or CRI is a dimensionless lighting quantity which is familiar to the person skilled in the art and which compares the colour reproduction faithfulness of an artificial light source with that of sunlight or filament light sources (the two last-mentioned have a CRI of 100).

CIE x and CIE y stand for the coordinates in the CIE standard colour diagram (here standard observer 1931), which is familiar to the person skilled in the art, by means of which the colour of a light source is described. All the quantities mentioned above are calculated by methods familiar to the person skilled in the art from emission spectra of the light source.

The present invention thus furthermore relates to a light source which comprises a primary light source and a phosphor mixture according to the invention.

Here too, it is particularly preferred for the phosphor mixture, besides the green-emitting conversion phosphor according to the invention, to comprise at least one further, preferably red-emitting conversion phosphor, so that the light source preferably emits white light or, in a further preferred embodiment, light having a certain colour point.

The light source according to the invention is preferably a pc-LED. A pc-LED generally comprises a primary light source and a phosphor mixture according to the invention.

The primary light source can be a semiconductor chip, a luminescent light source, such as ZnO, a so-called TCO (transparent conducting oxide), a ZnSe- or SiC-based arrangement, an arrangement based on an organic light-emitting layer (OLED) or a plasma or discharge source, most preferably a semiconductor chip. Possible forms of primary light sources of this type are known to the person skilled in the art.

If the primary light source is a semiconductor chip, it is preferably a luminescent indium aluminium gallium nitride (InAlGaN), as is known in the prior art.

In a preferred embodiment, the light source according to the invention comprises a UV-emitting primary light source, preferably a UV-LED with a power consumption of 1 W and an emission at 390 nm, and a phosphor mixture comprising one or more green-emitting conversion phosphors of the formula I, preferably selected from compounds of the formulae V-5 and V-6 in the mixing ratio 1:1 (% w/w) and optionally one or more red-emitting conversion phosphors, preferably selected from the group of the nitrides, particularly preferably selected from the group (Sr,Ca,Ba)₂Si₅N₈:Eu, (Ca,Sr)AlSiN₃:Eu) and/or the oxynitrides known from WO 2011/091839 A1 (Merck), in the ratio 80:20 (% w/w) of phosphor according to the invention to red-emitting conversion phosphor.

In a further preferred embodiment, the light source according to the invention comprises a blue-emitting primary light source, preferably an LED with a power consumption of 1 W and an emission at 447 nm, and a phosphor mixture comprising one or more green-emitting conversion phosphors of the formula I, preferably selected from compounds of the formula V-5, and optionally one or more red-emitting conversion phosphors, preferably selected from the group of the nitrides, particularly preferably selected from the group (Sr,Ca,Ba)₂Si₅N₈:Eu, (Ca,Sr)AlSiN₃:Eu) and/or the oxynitrides known from WO 2011/091839 A1 (Merck), in the ratio 80:20 (% w/w) of conversion phosphor according to the invention to red-emitting conversion phosphor.

Since the phosphor layer applied to a primary light source preferably consists of a mixture of silicone and homogeneous phosphor particles which is applied by bulk casting, and the silicone has a surface tension, this layer of the phosphor mixture is not uniform at a microscopic level or the thickness of the layer is not constant throughout. This is generally also the case if the phosphor mixture is not applied by the bulk-casting process, but instead in the so-called chip-level conversion process, in which a highly concentrated, thin layer of the phosphor mixture is applied directly to the surface of the primary light source with the aid of electrostatic methods.

With the aid of the above-mentioned process, it is possible to produce any desired outer shapes or phosphor bodies from the phosphor mixture, such as spherical particles, flakes and structured materials and ceramics.

The preparation of flake-form phosphor bodies as a further preferred embodiment is carried out by conventional processes from the corresponding semi-metal, metal and rare-earth salts. The preparation process is described in detail in EP 763573 and DE 102006054331, which are incorporated in their full scope into the context of the present application by way of reference. These flakes can be prepared by coating a natural or synthetically prepared, highly stable support or a substrate comprising, for example, mica, SiO₂, Al₂O₃, ZrO₂, glass or TiO₂ flakes which has a very large aspect ratio, an atomically smooth surface and an adjustable thickness with a layer of the phosphor mixture by a precipitation reaction in aqueous dispersion or suspension. Besides mica, ZrO₂, SiO₂, Al₂O₃, glass or TiO₂ or mixtures thereof, the flakes may also consist of the phosphor mixture itself, or be built up from another material. If the flake itself merely serves as support for the phosphor mixture, it must consist of a material which is transparent to the primary radiation of the primary light source, or absorbs the primary radiation and transfers this energy to the phosphor mixture. The flake-form phosphor bodies are dispersed in a resin (for example silicone or epoxy resin), and this dispersion is applied to the primary light source.

The flakes here can be produced on a large industrial scale in thicknesses of 50 nm to about 20 μm, preferably between 150 nm and 5 μm. The diameter here is 50 nm to 20 μm.

The flakes generally have an aspect ratio (ratio of the diameter to the particle thickness) of 1:1 to 400:1 and in particular 3:1 to 100:1. The flake dimensions (length×width) are dependent on the arrangement. Flakes are also suitable as centres of scattering within the conversion layer, in particular if they have particularly small dimensions.

The surface of the flake-form phosphor body according to the invention facing the primary light source may be provided with a coating which has an antireflection action with respect to the primary radiation emitted by the primary light source. This results in a reduction in back-scattering of the primary radiation, enabling the latter to be coupled better into the phosphor bodies according to the invention.

Suitable for this purpose are, for example, coatings of matched refractive index, which must have a following thickness d: d=[wavelength of the primary radiation of the primary light source/(4*refractive index of the phosphor ceramic)], see, for example, Gerthsen, Physik [Physics], Springer Verlag, 18th Edition, 1995. This coating may also consist of photonic crystals, also including structuring of the surface of the flake-form phosphor bodies in order to achieve certain functionalities.

The resent invention furthermore relates to a phosphor according to the invention in the form of a ceramic body. In the case of ceramic phosphor bodies, no location-dependent variations of the excitation and emission of the phosphor bodies takes place, which means that the LED provided therewith emits a homogeneous light cone of constant colour and has high light output. The ceramic phosphor bodies can be produced on a large industrial scale, for example, as flakes in thicknesses of a few 100 nm to about 500 μm. The flake dimensions (length×width) are dependent on the arrangement. In the case of direct application to the chip, the size of the flake should be selected in accordance with the chip dimensions (from about 100 μm*100 μm to several $mm^2$) with a certain oversize of about 10% to 30% of the chip surface with a suitable chip arrangement (for example flip-chip arrangement) or correspondingly. If the flake of the phosphor body is installed over a finished LED, the entire exiting light cone passes through the flake.

The side surfaces of the ceramic phosphor body can be coated with a light metal or noble metal, preferably aluminium or silver. The metal coating has the effect that light does not exit laterally from the phosphor body. Light exiting laterally can reduce the luminous flux to be coupled out of the LED. The metal coating of the ceramic phosphor body is carried out in a process step after the isostatic pressing to give rods or flakes, where the rods or flakes can optionally be cut to the requisite size before the metal coating. To this end, the side surfaces are wetted, for example, with a solution comprising silver nitrate and glucose and subsequently exposed to an ammonia atmosphere at elevated temperature. A silver coating, for example, forms on the side surfaces in the process.

Alternatively, currentless metallisation processes are also suitable, see, for example, Hollemann-Wiberg, Lehrbuch der Anorganic Chemie [Textbook of Inorganic Chemistry], Walter de Gruyter Verlag or Ullmanns Enzyklopädie der chemischen Technologie [Ullmann's Encyclopaedia of Chemical Technology].

The ceramic phosphor body can, if necessary, be fixed to the baseboard of a primary light source using a water-glass solution.

In a further embodiment, the ceramic phosphor body has a structured (for example pyramidal) surface on the side opposite a primary light source. This enables as much light as possible to be coupled out of the phosphor body.

The phosphor bodies in the form of ceramic bodies are produced, for example, by the process described in DE 102006037730 (Merck), which is incorporated into the context of the present application in its full scope by way of reference, but also other processes known to the person skilled in the art can be employed for the production of the ceramic phosphor bodies, such as, for example, sintering.

The phosphor is preferably produced by wet-chemical methods by mixing the corresponding starting materials and dopants, subsequently pressed isostatically and applied directly to the surface of the primary light source in the form of a homogeneous thin and non-porous flake. A structured surface on the phosphor body is preferably produced by carrying out the isostatic pressing using a compression mould having a structured pressure plate and thus embossing a structure into the surface. Structured surfaces are desired if the aim is to produce the thinnest possible phosphor bodies or flakes. The pressing conditions are known to the person skilled in the art (see J. Kriegsmann, Technische keramische Werkstoffe [Industrial Ceramic Materials], Chapter 4, Deutscher Wirtschaftsdienst, 1998). It is important that the pressing temperatures used are $\frac{2}{3}$ to $\frac{5}{6}$ of the melting point of the substance to be pressed.

The invention furthermore relates to a lighting unit which comprises at least one light source according to the invention. Lighting units of this type are employed, inter alia, in display devices, in particular liquid-crystal display devices (LC displays) with backlighting. Especially for applications in a liquid-crystal display, it is of particular importance that the emitting phosphors have a narrow-band emission band outside the absorption range of the colour filter in order to ensure high transmission.

In the lighting unit according to the invention, the optical coupling between the phosphor body and the primary light source (in particular semiconductor chip) is preferably effected by a light-conducting arrangement. This makes it possible to install the primary light source at a central location and to couple this optically to the phosphor body by means of light-conducting devices, such as, for example, optical fibres. In this way, it is possible to achieve phosphor bodies matched to the lighting wishes which comprise one or more of the conversion phosphors according to the invention, preferably selected from the compounds of the formula V-5, which may be arranged to form a light screen, and an optical waveguide, which is coupled to the primary light source.

This makes it possible to place a strong primary light source at a location which is favourable for electrical installation and, without further electrical cabling, merely by laying optical waveguides at any desired locations, to install phosphor bodies comprising one or more of the phosphors according to the invention which are coupled to the optical waveguides.

Preference is furthermore given to a lighting unit, in particular for general lighting, which is characterised in that it has an CRI (=colour rendering index) >60, preferably >70, more preferably >85. However, CRI values >85 can only be achieved if the conversion phosphor of the formula I according to the invention, preferably selected from the compounds of the formula V-6, is additionally combined in the LED with red-emitting phosphors, preferably selected from the group of the nitrides, particularly preferably selected from the group $(Sr,Ca,Ba)_2Si_5N_8$:Eu, $(Ca,Sr)AlSiN_3$:Eu) and/or the oxynitrides known from WO 2011/091839 A1 (Merck), in the ratio 80:20 (% w/w) of conversion phosphor according to the invention to red-emitting conversion phosphor.

The present invention furthermore relates to the use of the phosphors according to the invention as electroluminescent materials, such as, for example, electroluminescent films (also known as lighting films or light films), in which, for example, zinc sulfide or zinc sulfide doped with $Mn^{2+}$, $Cu^+$ or $Ag^+$ is employed as emitter, which emit in the yellow-green region. The areas of application of the electroluminescent film are, for example, advertising, display backlighting in liquid-crystal display screens (LC displays) and thin-film transistor (TFT) displays, self-illuminating vehicle licence plates, floor graphics (in combination with a crush-resistant and slipproof laminate), in display and/or control elements, for example in automobiles, trains, ships and aircraft, or also domestic appliances, garden equipment, measuring instruments or sport and leisure equipment.

Essential features of the invention in the form of a numbered list are:

1. Compound of the formula I $$(A_{1-w}Eu_w)(E_{12-2z}(G_1Mg_1)_z)O_{19} \qquad I$$

in which
A denotes one or more divalent elements selected from the group Sr, Ba and Ca,
E denotes one or more trivalent elements selected from the group Al, Ga, In and Sc,
G denotes one or more tetravalent elements selected from the group Si and Ge, and
$0<z\leq 4$,
$0.01\leq w\leq 0.4$.
2. Compound according to 1, characterised in that $z=1$.
3. Compound according to 1 or 2, characterised in that G=Si.
4. Compound according to one or more of points 1 to 3, characterised in that $0.01\leq w\leq 0.1$.
5. Compound according to one or more of points 1 to 4, characterised in that the compounds of the formula I are selected from the compounds of the formulae V-1 to V-7

$$((Sr_sBa_rCa_t)_{1-w}Eu_w)(Al_{10}SiMg)O_{19} \qquad V\text{-}1$$

$$((Ca_rBa_r)_{1-w}Eu_w)(Al_{10}SiMg)O_{19} \qquad V\text{-}2$$

$$((Sr_sBa_r)_{1-w}Eu_w)(Al_{10}SiMg)O_{19} \qquad V\text{-}3$$

$$((Sr_sCa_t)_{1-w}Eu_w)(Al_{10}SiMg)O_{19} \qquad V\text{-}4$$

$$(Sr_{1-w}Eu_w)(Al_{10}SiMg)O_{19} \qquad V\text{-}5$$

$$(Ba_{1-w}Eu_w)(Al_{10}SiMg)O_{19} \qquad V\text{-}6$$

$$(Ca_{1-w}Eu_w)(Al_{10}SiMg)O_{19} \qquad V\text{-}7$$

in which $0<r<1$, $0<s<1$, $0<t<1$, where $r+s+t=1$ and w has the meaning indicated under formula I.
6. Process for the preparation of a compound according to one or more of points 1 to 5, characterised in that silicon dioxide and/or germanium dioxide is mixed with at least one magnesium compound, at least one aluminium, indium, scandium or gallium compound, at least one barium, strontium or calcium compound and at least one europium compound, and the mixture is subsequently thermally treated.
7. Process according to point 6, characterised in that the thermal treatment of the mixture is carried out in 2 steps, where, in a first step, the mixture is calcined under air at a temperature >800° C. and is subsequently calcined under reducing conditions at a temperature >1000° C.
8. Phosphor mixture comprising one or more compounds according to one or more of points 1 to 5.
9. Phosphor mixture according to point 8, additionally comprising at least one red-emitting conversion phosphor.
10. Phosphor mixture according to point 8 or 9, additionally comprising at least one blue-emitting conversion phosphor.
11. Light source comprising a primary light source and a phosphor mixture according to one or more of points 8 to 10.
12. Lighting unit comprising at least one light source according to point 11.

The following examples are intended to illustrate the present invention. However, they should in no way be regarded as limiting. All compounds or components which can be used in the compositions are either known and commercially available or can be synthesised by known methods. The temperatures indicated in the examples are always in ° C. It furthermore goes without saying that, both in the description and also in the examples, the added amounts of the components in the compositions always add up to a total of 100%. Percentage data given should always be regarded in the given context. However, they usually always relate to the weight of the part-amount or total amount indicated.

EXAMPLES

Example 1

Preparation of $Sr_{0.96}Eu_{0.04}Al_{10}MSiO_{19}$ 2.28 g of strontium carbonate (0.015 mol), 21.70 g of basic aluminium carbonate (0.081 mol, Alfa Aesar), 1.37 g of magnesium carbonate (0.016 mol, Acros), 0.975 g of silicon dioxide (0.016 mol, Aldrich) and 0.142 g of europium oxide (0.004 mol, Treibacher) are homogenised in a hand mortar. The mixture is calcined at 1000° C. under air for 4 hours. The phosphor precursor obtained in this way is subsequently calcined at 1300° C. under a nitrogen/hydrogen atmosphere (10% proportion of hydrogen) for 4 hours. The crude phosphor is subsequently comminuted by means of a hand mortar, sieved (pore size <36 μm) and characterised by spectroscopy.

Example 2

Blue LED as Primary Light Source 1. 1 g of a green phosphor having the chemical composition $Sr_{0.96}Eu_{0.04}Al_{10}MgSiO_{19}$ and 5 g of a red phosphor having the chemical composition $Sr_{1.94}Eu_{0.06}Si_5N_{7.67}O_{0.5}$ are weighed out and mixed homogeneously in a Speedmixer. This phosphor mixture is then dispersed in an optically transparent silicone in a concentration of 8% w/w. The silicone/phosphor mixture obtained in this way is applied to the chip of a blue semiconductor LED (LED with power consumption of 1 W and an emission at 447 nm) with the aid of an automatic dispenser and cured with supply of heat.

Example 3

UV-LED as Primary Light Source 2. 1 g of a green phosphor having the chemical composition $Sr_{0.96}Eu_{0.04}Al_{10}MgSiO_{19}$ and 5 g of a red phosphor having the chemical composition $Sr_{1.94}Eu_{0.06}Si_5N_{7.67}O_{0.5}$ are weighed out and mixed homogeneously in a Speedmixer. This phosphor mixture is then dispersed in an optically transparent silicone in a concentration 6% w/w. The silicone/phosphor mixture obtained in this way is applied to the chip of a UV-emitting semiconductor LED (UV-LED with a power consumption of 1 W and an emission at 390 nm) with the aid of an automatic dispenser and cured with supply of heat.

The invention claimed is:

1. Compound of the formula I $$(A_{1-w}Eu_w)(E_{12-2z}(G_1Mg_1)_z)O_{19} \quad \text{I}$$

in which

A denotes one or more divalent elements selected from the group Sr, Ba and Ca,

E denotes one or more trivalent elements selected from the group Al, Ga, In and Sc, G denotes one or more tetravalent elements selected from the group Si and Ge, and $0 < z \leq 4$, $0.01 \leq w \leq 0.4$.

2. Compound according to claim 1, characterised in that z=1.

3. Compound according to claim 1, characterised in that G=Si.

4. Compound according to claim 1, characterised in that $0.01 \leq w \leq 0.1$.

5. Compound according to claim 1, characterised in that the compounds of the formula I are selected from the compounds of the formulae V-1 to V-7

$$((Sr_sBa_rCa_t)_{1-w}Eu_w)(Al_{10}SiMg)O_{19} \quad \text{V-1}$$

$$((Ca_rBa_r)_{1-w}Eu_w)(Al_{10}SiMg)O_{19} \quad \text{V-2}$$

$$((Sr_sBa_r)_{1-w}Eu_w)(Al_{10}SiMg)O_{19} \quad \text{V-3}$$

$$((Sr_sCa_r)_{1-w}Eu_w)(Al_{10}SiMg)O_{19} \quad \text{V-4}$$

$$(Sr_{1-w}Eu_w)(Al_{10}SiMg)O_{19} \quad \text{V-5}$$

$$(Ba_{1-w}Eu_w)(Al_{10}SiMg)O_{19} \quad \text{V-6}$$

$$(Ca_{1-w}Eu_w)(Al_{10}SiMg)O_{19} \quad \text{V-7}$$

in which $0 < r < 1$, $0 < s < 1$, $0 < t < 1$, where $r+s+t=1$ and w has the meaning indicated under formula I.

6. Process for the preparation of a compound according to claim 1, characterised in that silicon dioxide and/or germanium dioxide is mixed with at least one magnesium compound, at least one aluminium, indium, scandium or gallium compound, at least one barium, strontium or calcium compound and at least one europium compound, and the mixture is subsequently thermally treated.

7. Process according to claim 6, characterised in that the thermal treatment of the mixture is carried out in 2 steps, where, in a first step, the mixture is calcined under air at a temperature >800° C. and is subsequently calcined under reducing conditions at a temperature >1000° C.

8. Phosphor mixture comprising one or more compounds according to claim 1.

9. Phosphor mixture according to claim 8, additionally comprising at least one red-emitting conversion phosphor.

10. Phosphor mixture according to claim 8, additionally comprising at least one blue-emitting conversion phosphor.

11. Light source comprising a primary light source and a phosphor mixture according to claim 8.

12. Lighting unit comprising at least one light source according to claim 11.

* * * * *